United States Patent
Yoon et al.

(10) Patent No.: US 7,977,674 B2
(45) Date of Patent: Jul. 12, 2011

(54) PHASE CHANGE MEMORY DEVICE AND METHOD OF FABRICATING THE SAME

(75) Inventors: Sung Min Yoon, Daejeon (KR); Byoung Gon Yu, Daejeon (KR); Seung Yun Lee, Daejeon (KR); Young Sam Park, Daejeon (KR); Kyu Jeong Choi, Daejeon (KR); Nam Yeal Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 309 days.

(21) Appl. No.: 12/240,013

(22) Filed: Sep. 29, 2008

(65) Prior Publication Data

US 2009/0184307 A1 Jul. 23, 2009

(30) Foreign Application Priority Data

Jan. 23, 2008 (KR) .................. 10-2008-0007208
Mar. 11, 2008 (KR) .................. 10-2008-0022402

(51) Int. Cl.
*H01L 29/08* (2006.01)
*H01L 29/18* (2006.01)
*H01L 29/02* (2006.01)
*H01L 47/00* (2006.01)
*H01L 21/06* (2006.01)

(52) U.S. Cl. ....... 257/42; 257/2; 257/E31.029; 438/102; 438/103

(58) Field of Classification Search .......... 438/102–103; 257/2, 42, E31.029
See application file for complete search history.

(56) References Cited

U.S. PATENT DOCUMENTS

| 5,166,758 A | 11/1992 | Ovshinsky et al. |
| 5,296,716 A | 3/1994 | Ovshinsky et al. |
| 5,789,758 A | 8/1998 | Reinberg |

(Continued)

FOREIGN PATENT DOCUMENTS

KR 10-0379322 7/2003

(Continued)

OTHER PUBLICATIONS

Do, Kihoon et al., "Phase Transformation Behavior of N-doped Ge2Sb2+xTe5 Thin Films (x = 0, 0.2) for Phase Change Memory", Journal of the Electrochemical Society 154 (10) H867-H870, published Aug. 13, 2007.*

(Continued)

*Primary Examiner* — Matthew C Landau
*Assistant Examiner* — Daniel Luke
(74) *Attorney, Agent, or Firm* — Rabin & Berdo, P.C.

(57) ABSTRACT

A phase change memory device and a method of fabricating the same are provided. A phase change material layer of the phase change memory device is formed of germanium (Ge)-antimony (Sb)-Tellurium (Te)-based $Ge_2Sb_{2+x}Te_5$ ($0.12 \leq x \leq 0.32$), so that the crystalline state is determined as a stable single phase, not a mixed phase of a metastable phase and a stable phase, in phase transition between crystalline and amorphous states of a phase change material, and the phase transition according to increasing temperature directly transitions to the single stable phase from the amorphous state. As a result, set operation stability and distribution characteristics of set state resistances of the phase change memory device can be significantly enhanced, and an amorphous resistance can be maintained for a long time at a high temperature, i.e., around crystallization temperature, and thus reset operation stability and rewrite operation stability of the phase change memory device can be significantly enhanced.

19 Claims, 6 Drawing Sheets

U.S. PATENT DOCUMENTS

2007/0025226 A1* 2/2007 Park et al. .................. 369/100
2007/0267676 A1* 11/2007 Kim et al. .................. 257/311
2008/0029752 A1* 2/2008 Karpov et al. .................. 257/2

FOREIGN PATENT DOCUMENTS

KR  10-2007-0103701      10/2007
KR  10-2008-0016120       2/2008
WO  WO 2007029938 A1 *   3/2007

OTHER PUBLICATIONS

Kim et al., "Variation of the Complex Refractive Indicies with Sb-addition in Ge-Sb-Te Alloy and Their Wavelength Dependence", SPIE vol. 3401, pp. 112-115, published May 16, 2003.*

"Crystallization Behavior and Physical Properties of Sb-Excess $Ge_2Sb_{2+x}Te_5$ Thin Films for Phase Change Memory (PCM) Devices," S. O. Ryu et al.; Journal of The Electrochemical Society; Jan. 25, 2006; 153 (3) G234-G237.

"Phase-Change Behavior of Stoichiometric $Ge_2Sb_2Te_5$ in Phase-Change Random Access Memory," Jong-Bong Park et al.; Journal of the Electrochemical Society; Jan. 5, 2007; 154 (3) H139-H141.

"Electrical Characterization of Nonvolatile Phase-Change Memory Devices Using Sb-Rich Ge-Sb-Te Alloy Films", Sung-Min Yoon et al., Japanese Journal of Applied Physics vol. 46, No. 11, 2007, pp. 7225-7231.

"Structure of laser-crystallized $Ge_2Sb_{2+x}Te_5$ sputtered thin films for use in optical memory", Noboru Yamada et al., Journal of Applied Physics vol. 88, No. 12, pp. 7020-7028, Dec. 15, 2000.

"Density changes upon crystallization of $Ge_2Sb_{2.04}Te_{4.74}$ films", Walter K. Njoroge et al., J. Vac. Sci. Technol. A 20(1), pp. 230-233, Jan./Feb. 2002.

"Crystallization behavior of as-deposited, melt quenched, and primed amorphous states of $Ge_2Sb_{2.3}Te_5$ films", Pramod K. Khulbe et al., Journal of Applied Physics, vol. 88, No. 7, pp. 3926-3933, Oct. 1, 2000.

* cited by examiner

PHASE CHANGE MEMORY DEVICE AND METHOD OF FABRICATING THE SAME

CROSS-REFERENCE TO RELATED APPLICATION

This application claims priority to and the benefit of Korean Patent Application Nos. 2008-7208, filed Jan. 23, 2008 and 2008-22402, filed Mar. 11, 2008, the disclosures of which are incorporated herein by reference in their entirety.

BACKGROUND

1. Field of the Invention

The present invention relates to a phase change memory device and a method of fabricating the same, and more particularly, to a phase change memory device using a chalcogenide metal alloy formed of germanium (Ge), antimony (Sb) and tellurium (Te) as a phase change material, and a method of fabricating the same.

2. Discussion of Related Art

Semiconductor memories may be classified into two kinds, namely, volatile memories and non-volatile memories. The volatile memories lose all data stored therein when power is interrupted, but the non-volatile memories do not lose the stored data even when power is interrupted. Following the recent rapid development of mobile appliances exemplified by personal data assistants (PDAs), the non-volatile memories are widely used in various hand-held terminals. Further, when conventional volatile memories such as a dynamic random access memory (DRAM) or a static random access memory (SRAM) may be replaced with the non-volatile memories, reduction of power consumption and great reduction of operating time may be expected. Among the non-volatile memories, flash memories are the most developed and purchasable memory. Recently, the flash memories including an NOR type and an NAND type have expanded their market based on the technical background described above. However, since the flash memories have disadvantages such as a low operating speed and a use of relatively high voltage, they cannot replace conventionally-used universal memories such as DRAMs or SRAMs right now, and are currently used mainly in mobile appliances such as digital cameras or cellular phones as information storage media thereof.

Meanwhile, one of the principle capabilities that the memory must have is a reliable rewrite operation. Although the flash memory does not have a reliable rewrite operation, under the condition of use only in the mobile appliances including PDAs, rewrite cycles can be greatly reduced. However, a stable operation in a universal PC cannot be guaranteed by the rewrite operation reliability required for the mobile appliances.

Today, to satisfy specifications of memory required for hand-held mobile appliances and digital appliances having convergence functions, a method of properly mixing DRAM, SRAM and flash memory is adopted to apply all advantages that the respective memory modules have. However, this method significantly increases a size of an entire memory chip and production costs. Since there is no memory satisfying all conditions such as high speed, high density and non-volatility at the same time, the method is reluctantly chosen, but cannot be said to be effective.

In addition, with a current trend to miniaturization of a silicon fabrication process, which is developing very fast, it is indicated that there is a theoretical limitation to ensure predetermined operating characteristics by miniaturizing a flash memory device, and high integration of the flash memory is predicted to reach a limit within ten years from now.

For these reasons, researchers and developers have been working in the memory field eagerly expecting the advent of an all-around integrated memory which can be stably mounted on any device for any purpose. The integrated memory must be non-volatile, and have high speed, low power consumption and good rewrite operation reliability. However, until now, no such semiconductor memory having all of these performances has been commercialized. Accordingly, a variety of non-volatile memory technology is being vigorously developed and investigated from all angles in possibility of development and practical use.

Other than the improvement of the operating performances of the flash memory, four candidates of technology for the next generation non-volatile memory device easily replacing the flash memory in an ultrafine silicon device process generation are being actively investigated, which include: (1) Ferroeletric RAM (FeRAM); (2) Magneto-resistive RAM (MRAM); (3) Phase change RAM (PRAM); and (4) Resistive RAM (RRAM). While all of these non-volatile memory technologies have advantages and disadvantages, FeRAM and MRAM have been studied for relatively longer than PRAM and RRAM. The results of researches and developments have consistently indicated that FeRAM and MRAM have technical problems of ineffective fabrication of the device in an aggressive miniaturization process, and difficulty of guaranteeing preferable and reliable operating characteristics. Thus, it has been determined that these non-volatile memory devices cannot replace the flash memory, and thus the technology to be used in a non-volatile memory market for specific uses continues to be developed.

Meanwhile, one non-volatile memory, a phase change RAM (PRAM), stores data by selecting a method of applying current or voltage under proper conditions to control a crystalline state of a material, and reads out the kind of the stored data based on resistance change according to the crystalline state of the material, using a phase change material having a variable resistance according to the crystalline state of the material. Here, the material has a low resistance characteristic in a crystalline state, but a high resistance characteristic in an amorphous state. In the phase change memory device, conversion from the high-resistance amorphous state to the low-resistance crystalline state is referred to as a set operation, and conversion from the low-resistance crystalline state to the high-resistance amorphous state is referred to as a reset operation.

Meanwhile, in the fabrication of the phase change memory device, the same degree of integration as that of DRAM may be easily realized, since a phase change material formed of a chalcogenide metal alloy which has been typically used in an optical storage information device such as CD-RW or DVD may be used, and a fabrication process for the phase change memory device is consistent with a conventional fabrication process for a silicon-based device. On the other hand, the MRAM and FeRAM compared with the phase change memory experience a drastic increase in difficulty of the process due to the miniaturization of the device, or performance degradation of the device itself. In view of the development of the technology so far, the phase change memory can be the most prominent candidate for the next generation non-volatile memory to replace the current flash memory, and thus is the semiconductor memory technology that is receiving growing attention.

However, to commercialize the phase change memory, there are two technical issues which must be addressed.

The first technical issue is great reduction of power consumption required to drive the memory device. The phase change memory device is driven by controlling the crystalline state of the phase change material using electrical Joule-heat generated when current is applied to a resistor as described above, and thus can consume a relatively large amount of power. In addition, this problem is associated with why the phase change memory device has not received much attention until now even though it has relatively favorable advantages than other types of non-volatile memories. That is, a design rule used in a semiconductor process is scaled down by a specific scaling method, and thus, when the phase change memory device is fabricated by a conventional semiconductor process fabricating a relatively large-scaled device, it is impossible to realize a memory device having practical operating characteristics due to generation of power and heat which are unequal to an entire system. However, as a size of the device itself decreases together with a continuous downscale of the design rule, the power consumption required to operate the phase change memory device can be greatly reduced by the current design rule of the typical semiconductor process.

Meanwhile, an effort to reduce a current size for the operation of the phase change memory device is progressing, and various methods of reducing an absolute current required for the operation of the phase change memory device are being studied. More particularly, a method of changing a kind of the phase change material, or a method of changing a structure of the phase change memory device may be used.

The second technical issue is that there is a need of improving operating reliability of the phase change memory device. In regard to the operating reliability of the phase change memory device, there are three operating conditions.

The first operating condition that should be considered in regard to the operating reliability of the phase change memory device is that no data stored in an adjacent memory device be damaged or changed due to heat generated during the memory operation in a specific device. Particularly, a gap between devices in a memory array which is highly integrated is highly likely to be reduced continuously in the future, and in some cases the heat generated during the memory operation of the specific cell serves as a noise factor, which may inhibit the memory operation of an adjacent cell. This phenomenon is generally referred to as cross-talk in a memory array operation. In the phase change memory device, the reduction of the operating current, the first technical issue described above, becomes a very important factor in preventing the cross-talk and implementing the stable memory array operation. That is, a low power consuming operation is necessary to inhibit an increase in temperature of the memory cell during the operation of the memory device. Thus, to guarantee reliable memory operation in the phase change memory with a high degree of integration, the structural development of a low power consuming device is essential.

The second operating condition that should be considered in regard to the operation reliability of the phase change memory device is that data stored in the device must be retained even with the passage of time. That is, a set or reset data value, which is written to the phase change memory device, must be retained for a long time, and particularly at a high temperature at which a chip having a memory array is actually operated. Regarding the characteristics of the non-volatile memory, these requirements are mainly associated with a data retention characteristic. In addition, since the phase change memory device uses changes of the crystalline state of the material due to heat energy and electrical resistance of the material that the phase change material experiences, it is very important to extend retention time of the phase change memory device by improving the kind of the material and the structure of the device.

The third operating condition that should be considered in regard to the operating reliability of the phase change memory device is that data must be stored stably during repetitive write operations of the phase change memory device. In other words, it is essential to ensure a rewrite characteristic for erasing data written in advance and rewriting new data by repeating set and reset operations in the phase change memory device. It is reported that the number of rechargeable cycles of the phase change memory device is about $10^8$, which is the most favorable data obtained using a test device fabricated under the optimized conditions. And thus, considering a characteristic deviation of a unit memory device constituting an actual memory array, it is estimated that the number of rechargeable cycles of the phase change memory device is about $10^5$ to $10^7$. This data is a little bit higher than the flash memory, but still not enough to replace the flash memory with the phase change memory device and open up new markets in an embedded memory field, and a next generation integrated non-volatile memory field which will replace SRAM or DRAM in the future. Thus, it is expected that the improvement of the rewrite characteristic of the phase change memory device will become a necessary and sufficient condition for the phase change memory to enter into applications other than the flash memory.

Meanwhile, it is known that the rewrite characteristic of the phase change memory device is limited by some mechanism that destroys the operation of the device. The first operation breakdown mechanism inhibiting the rewrite operation in the phase change memory device is a reset operation incapability (set-stuck) mechanism. The set-stuck mechanism is a mechanism in which a resistance of the device is fixed to a low-resistance set state and unable to be switched into a reset operation while the phase change memory device repeats a set operation and a reset operation and rewrites data. This is because a composition in the phase change material layer constituting the phase change memory device is greatly changed compared with an initial composition thereof due to repeated current application and heating experienced by the memory device, and phase transition of the material, so that a conductive current path perpendicularly passes through the phase change material layer, or due to these causes, the phase change material and elements forming upper and lower electrodes diffuse into each other, so that a conductive current path is formed in the memory device. The second operation breakdown mechanism inhibiting the rewrite operation in the phase change memory device is a set operation incapability (reset-stuck) mechanism. The reset-stuck is a mechanism in which the resistance of the device is fixed to the reset resistance or a higher resistance than the reset resistance and unable to be switched into the set operation. As described above, this is because the composition of the phase change memory device is greatly changed due to repeated current application and heating experienced by the memory device, and the phase transition of the material, so that an amorphous material formed during the reset operation forms a third phase that is not changed into the set state any more, or due to the above causes, the phase change material and the upper and lower electrodes are mechanically separated, so that they cannot be electrically connected with one another anymore. Particularly, this mechanism is caused by a volume change of the phase change material unavoidably experienced during the phase transition. The third operation breakdown mechanism inhibiting the rewrite operation of the phase change memory device is an operating current drift mechanism. The operating current drift phenomenon is a mechanism in which the current required for the reset operation and the current required for the set operation are greatly changed compared with the initial current after the phase change memory device has repeatedly performed the set and reset operations a predetermined number of times. That is, the set and reset operations themselves can be performed, but operating conditions are variable. This is because the electrode constituting the phase change memory device is not optimized, so that an unwanted third thin film is formed between the phase change materials, or the electrode is greatly degraded during the rewrite operation accompanied with heating. The fourth operation breakdown mechanism inhibiting the rewrite operation in the phase change memory device is an operating speed degradation phenomenon. The operating speed degradation phenomenon is that time required for the write operation becomes delayed as the memory operation of the phase change memory device is repeated. This phenomenon is typically observed when the phase change memory device writes set-state data in the reset state, which is because the set operation occurs with crystallization of the phase change material. This is because the crystalline state or composition of the phase change material forming an operating region of the device is greatly changed by some reasons during the operation of the phase change memory device, so that a reversible phase change phenomenon is not properly expressed in the write operation.

Among the operation breakdown mechanisms inhibiting the rewrite operation of the phase change memory device described above, the phenomena associated with the phenomena of operating current drift and operating speed degradation are closely related to operating stability of a single memory device and an operating yield of an entire memory array formed of a plurality of memory cells. That is, in order to write certain data to a write unit with predetermined capacity including a memory cell where the phenomena of operating current drift and operating speed degradation occur, a margin between the set and reset conditions is increased to provide normal data to at least some memory cells where the degradation has been already started, so that there is no choice but to sacrifice operating performance of the entire memory array. In other words, to increase the operating yield of the phase change memory array, it is necessary to find an appropriate method of preventing the occurrence of operating current drift and operating speed degradation.

Thus, to improve high temperature operating stability and rewrite operating characteristic of the phase change memory device and ensure the operating reliability of the device to the rewrite operating characteristic, it is urgent to develop a novel phase change material, which can avoid the four operation breakdown mechanisms, i.e., the set-stuck, the reset-stuck, the operating current drift, and operating speed degradation. However, research for improving the operating reliability of the phase change memory device has not been forthcoming, compared with those for reducing current required for the device operation, another technical issue in the phase change memory device as described above, and causes of these operation breakdown mechanisms have still not been clearly assessed.

Meanwhile, as the phase change material to form the phase change memory device, a chalcogenide metal alloy having germanium (Ge)-antimony (Sb)-tellurium (Te) in a certain composition, particularly, $Ge_2Sb_2Te_5$ (GST) having a composition of 2:2:5 has been mainly employed. Since GST has been widely used as a core material of an optical information storage medium using a phase change phenomenon due to laser light as described above, much has been discovered about physical properties of the material. Especially, GST is reversible in transition between an amorphous state and a crystalline state, has a very fast crystallization speed and good continuity in the phase transition. These are still considered significant advantages in application to the phase change memory device. Thus, GST is considered to be easily applied to the phase change memory device, and thus is actually employed to most phase change memory devices fabricated by manufactures.

However, successive reports on a demand for improved phase change memory devices using GST are produced since the device has some problems in the operational reliability thereof. For example, a study has disclosed that Te and Sb diffuse during a heat-generated operation, so that the phase change memory device including GST has greatly different composition from the initial one. Further, after several memory devices are inspected among the phase change memory devices including GST with the initial composition, some research shows that reset current drift and degradation in set operating speed are observed in some devices, which is because a part of an operating region of the phase change memory device has a second phase formed of Ge—Te, and that Ge segregation and a change into an oxide layer may occur even after only several cycles of the operation. In addition, other research shows that after the set-stuck occurs in the phase change memory device including GST, a composition of the device operating region of the corresponding device is very different from the initial composition, and in particular, the composition is changed into an Sb-rich composition. Meanwhile, the phase change material has been usually developed so far as a storage medium for an optical information storage apparatus, so that the material does not need to have tolerance to the rewrite operation for $10^8$ or more cycles like semiconductor memory, and strictly control distributions of electrical resistances of the amorphous and crystalline phase change materials. However, to guarantee stable operating reliability to the rewrite operation of the phase change memory device, there is a need to develop the phase change material with a stable composition in which the phase separation does not occur easily.

Based on the results described above, characteristics of the phase change material required to improve the operating stability and reliability of the phase change memory device are as follows:

First, the phase change material may have a single crystalline phase to improve set operation stability in the phase change memory device. GST including Ge—Sb—Te in a composition of 2:2:5 which are typically used to realize the current phase change memory device has two crystalline states of a metastable face-centered-cubic (fcc) structure and a hexagonal-closed-packing (hcp) structure according to the difference in crystallization temperature. Further, an fcc resistance is generally higher than an hcp resistance. When GST is applied to realize the optical information storage medium, since a difference of a refractive index between the crystalline phase and the amorphous phase in GST is changed by application of laser light, the difference of resistance between the fcc structure and the hcp structure has little effect on data storage and regeneration, and good material characteristics may be guaranteed to realize the optical information storage medium using fast crystallization speed and phase continuity expected due to the presence of the fcc structure. However, in the phase change memory device that uses electrical resistances in the crystalline and amorphous states to read data, the two structures in the crystalline state may not avoid the possibilities of wide distribution of set resistances during a set operation, and variable operating conditions required for a reset operation to be performed later. For this reason, to improve the set operation stability in the phase change memory device, it is preferable to make a novel composition of the phase change material having a single crystalline phase in a crystallization step according to application of heat energy.

Second, to improve reset operation stability in the phase change memory device, a reset resistance may be stably maintained for a long time at a relatively high temperature around the crystallization temperature of the phase change material. The phase change memory device set in the reset state by applying predetermined operating conditions experiences a high temperature environment during the operation. Firstly, a circumstance in which an operating temperature of a memory chip including a phase change memory array formed of a plurality memory cells typically increases in a range from 85 to 120° C. should be considered. As a result, within the above temperature condition, the memory device memorizing the reset data must not be changed into a third state having a lower resistance than a typical reset resistance after a predetermined time under the influence of the operating temperature. Secondly, considering an operating environment of the phase change memory array formed of a plurality of the memory cells, heat energy applied for the writing operation in a corresponding cell gives an effect on an adjacent cell. After predetermined cycles of the operation, the adjacent cell must not be changed into the third state having a lower resistance than the initial reset resistance. If the first and second circumstances actually occur in the phase change memory device, and after a predetermined time or predetermined cycles of the operation, a specific memory device is changed into the third state, in which a resistance is lower than the typical reset resistance or higher than the typical set resistance, the device may not stably perform reset and set operations under the predetermined operating conditions in the write operation. This may be a direct cause of inhibition of practical use of the phase change memory device in terms of operational margin and yield of the memory device and a fundamental cause of the operation breakdown mechanism in the phase change memory described above in some cases.

The operating characteristics required to realize the phase change memory device also include reduction of operating current and an increase in operating speed, in addition to the operational stability and reliability, and thus it is preferable that a phase change material with a novel composition for improving the stability and reliability of the phase change memory device does not greatly inhibit the operating current and speed characteristics.

As a result, when a phase change memory device is formed of a phase change material with a novel composition which has a single crystalline phase in a set state and retain a reset resistance at a high temperature for a long time, the phase change memory device may have more stable and better operating characteristics.

SUMMARY OF THE INVENTION

The present invention is directed to a phase change memory device with excellent operating stability and reliability using a novel phase change material composition, which has a stable single crystalline phase, not a mixed crystalline phase of a metastable phase and a stable phase, and an amorphous resistance maintained at a high temperature around crystallization temperature for a long time, during phase transition between crystalline and amorphous states of the phase change material.

One aspect of the present invention provides a phase change memory device, which includes a phase change material layer formed of germanium (Ge)-antimony (Sb)-tellurium (Te)-based $Ge_2Sb_{2+x}Te_5$ (x>0), wherein a composition (x) of antimony added to the $Ge_2Sb_{2+x}Te_5$ forming the phase change material layer as an excess ranges from 0.12 to 0.32.

That is, in the phase change memory device according to the present invention, the phase change material layer is formed of $Ge_2Sb_{2+x}Te_5$ in which Sb is added to conventional $Ge_2Sb_2Te_5$ having a composition of 2:2:5 among the Ge—Sb—Te-based metal alloys, and thus the phase change material layer has a single crystalline phase and an amorphous resistance characteristic which is maintained at a high temperature for a long time.

The crystalline state of $Ge_2Sb_{2+x}Te_5$ forming the phase change material layer may be a single hcp phase. When $Ge_2Sb_{2+x}Te_5$ include a metastable fcc phase, a ratio of the fcc phase to the hcp phase may be minimized. Further, a ratio of the single hcp phase included in the crystalline state of $Ge_2Sb_{2+x}Te_5$ forming the phase change material layer may be in proportional to an increase in additional Sb composition (x). When the crystalline state of $Ge_2Sb_{2+x}Te_5$ forming the phase change material layer is the single hcp phase, the additional Sb composition (x) may range from 0.22 to 0.32.

The amorphous resistance of $Ge_2Sb_{2+x}Te_5$ forming the phase change material layer may be maintained at a constant level for a predetermined time (e.g., 3 hours) at a high temperature lower than crystallization temperature by 30° C., and even when the amorphous resistance decreases by time, it may decrease more slowly than in the phase change material layer formed of $Ge_2Sb_2Te_5$ (x=0). Here, the composition (x) of antimony added to the $Ge_2Sb_{2+x}Te_5$ forming the phase change material layer as an excess may be determined within a range in which other characteristics required for the phase change memory device, e.g., operating current and speed, and a rewrite operating characteristic are not seriously damaged. Specifically, when Sb excessively included in the phase change material layer moves to a surface of the phase change material layer and diffuses into another layer, the operating characteristics of the phase change memory device may be seriously degraded. Thus, the composition (x) of antimony added to the $Ge_2Sb_{2+x}Te_5$ forming the phase change material layer as an excess may range from 0.12 to 0.27 to maintain the amorphous resistance of $Ge_2Sb_{2+x}Te_5$ at a constant level for a predetermined time at a temperature lower than the crystallization temperature of $Ge_2Sb_{2+x}Te_5$ by 30° C. and prevent diffusion of $Ge_2Sb_{2+x}Te_5$ into another layer.

As a result, the composition (x) of antimony added to the $Ge_2Sb_{2+x}Te_5$ forming the phase change material layer as an excess may range from 0.22 to 0.27 to improve operating stability and reliability of the phase change memory device including the phase change material layer and ensure other memory operating characteristics required for the phase change memory device.

Another aspect of the present invention provides a method of fabricating a phase change memory device, including forming a phase change material layer using $Ge_2Sb_{2+x}Te_5$ (x>0), wherein a composition (x) of antimony added to the $Ge_2Sb_{2+x}Te_5$ as an excess ranges from 0.12 to 0.32.

A crystalline structure of the $Ge_2Sb_{2+x}Te_5$ may have a single hcp phase, and when a metastable fcc phase is included, the ratio of the fcc phase may be minimized. Further, when the crystalline structure of the $Ge_2Sb_{2+x}Te_5$ has the single hcp phase, the composition (x) of antimony added to the $Ge_2Sb_{2+x}Te_5$ as an excess may range from 0.22 to 0.32

Moreover, the composition (x) of antimony added to the $Ge_2Sb_{2+x}Te_5$ as an excess may range from 0.12 to 0.27 to maintain an amorphous resistance of $Ge_2Sb_{2+x}Te_5$ at a constant level for a predetermined time at a temperature lower than crystallization temperature of $Ge_2Sb_{2+x}Te_5$ by 30° C., and to prevent diffusion of $Ge_2Sb_{2+x}Te_5$ into another layer.

As a result, the composition (x) of antimony added to the $Ge_2Sb_{2+x}Te_5$ forming the phase change material layer as an excess may range from 0.22 to 0.27 to improve operating stability and reliability of the phase change memory device including the phase change material layer and ensure other memory operating characteristics required for the phase change memory device.

BRIEF DESCRIPTION OF THE DRAWINGS

The above and other objects, features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Figure 1:
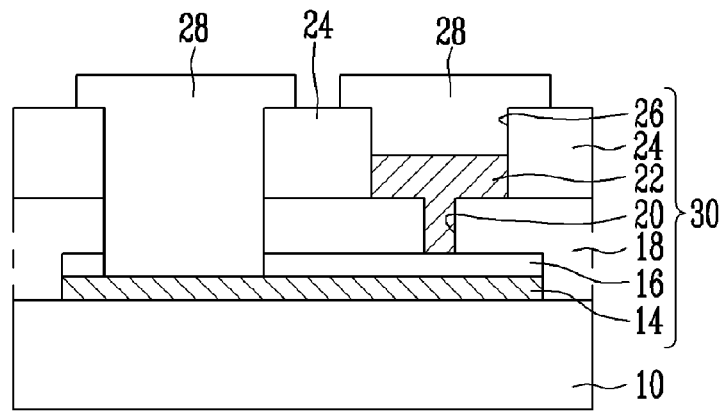
FIG. 1 is a cross-sectional view of a phase change memory device including a phase change material layer formed of $Ge_2Sb_{2+x}Te_5$ ($0.12 \leq x \leq 0.32$) according to the present invention.

Hereinafter, the present invention will be described in detail with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when a layer is described to be formed on other layer or on a substrate, this means that the layer may be formed on the other layer or on the substrate, or a third layer may be interposed between the layer and the other layer or the substrate. Like numerals refer to like elements throughout the specification.

A structure and characteristics of a phase change memory device according to the present invention will now be described in detail with reference to the accompanying drawings.

FIG. 1 is a cross-sectional view of a phase change memory device including a phase change material layer formed of $Ge_2Sb_{2+x}Te_5$ ($0.12 \leq x \leq 0.32$) according to the present invention.

Referring to FIG. 1, a substrate 10 may be, for example, a silicon substrate or a silicon oxide layer formed by thermally oxidizing a surface of silicon.

Meanwhile, the phase change memory device including the phase change material layer formed of $Ge_2Sb_{2+x}Te_5$ ($0.12 \leq x \leq 0.32$) (hereinafter, referred to as a '$Ge_2Sb_{2+x}Te_5$ memory device') according to the present invention may be formed in an array. When the $Ge_2Sb_{2+x}Te_5$ memory device is integrated together with circuit modules such as an XY decoder for driving a memory array and a sense amplifier, the device may be formed on a specific substrate on which a CMOS transistor or a bipolar transistor is arranged to constitute these circuits.

A stack 30 of the phase change memory device is disposed on the substrate 10. The stack 30 of the memory device includes a lower electrode layer 14, a heat-generating electrode layer 16, a first insulating layer 18, a phase change material layer 22, a second insulating layer 24 and an upper electrode layer 28, which are sequentially stacked. Meanwhile, the stack 30 of the $Ge_2Sb_{2+x}Te_5$ memory device according to the present invention is not necessarily formed on the substrate 10 formed of silicon or silicon oxide. That is, an array formed of the $Ge_2Sb_{2+x}Te_5$ memory device may be formed on the specific substrate already having the transistor.

The lower electrode layer 14 serves as a lower terminal of the phase change memory device, and is formed of a low-resistance metal electrode, for example, platinum (Pt), tungsten (W) or a titanium-tungsten (TiW) alloy, by sputtering or electron beam metal deposition.

The heat-generating electrode layer 16 generates sufficient heat to change a crystalline state of the phase change material at a portion in contact with the phase change material layer 22. The heat is generated by current supplied through the lower electrode layer 14, and the heat-generating electrode layer 16 has a higher resistance than the lower electrode layer 14. Care must be taken to determine a material and a method of forming the heat-generating electrode layer 16, which is an important component in determining operating characteristics of the phase change memory device. The heat-generating electrode layer 16 may be formed of one selected from the group consisting of titanium nitride (TiN), titanium oxynitride (TiON), titanium aluminum nitride (TiAlN), titanium silicon nitride (TiSiN), tantalum aluminum nitride (TaAlN) and tantalum silicon nitride (TaSiN).

The first insulating layer 18 serves to electrically insulate the phase change material layer 22, which is formed on the first insulating layer 18, from the heat-generating electrode layer 16 and the lower electrode layer 14, which are formed under the first insulating layer 18. The first insulating layer 18 may be formed of one selected from a silicon oxide layer, a silicon nitride (SiN) layer, a silicon-based insulating layer, and an organic insulating layer which may be formed at a low temperature.

For example, the first insulating layer 18 may be formed of a silicon oxide layer by chemical vapor deposition at a low temperature, so as to prevent oxidation of the heat-generating electrode layer 16 during the formation of the first insulating layer 18. Further, a proper isolation process may be performed using the first insulating layer 18. That is, when the silicon oxide layer is used as the first insulating layer 18, a portion to be defined as a phase change memory device region may be ensured by dry or wet etching to isolate the memory device portion therefrom.

Meanwhile, the first insulating layer 18 partially covers the heat-generating electrode layer 16, and has a pore 20 to partially expose a surface of the heat-generating electrode layer 16. The phase change material layer 22 is in contact with the heat-generating electrode layer 16 only through the pore 20 region.

Here, the pore 20 is a region where the phase change memory device is actually operated, and thus will be referred to hereinafter as an active pore 20. A size of the active pore 20 directly affects the operating characteristics of the phase change memory device, and may be proportional to a current value required for the operation of the device. Meanwhile, the size of the active pore 20 may vary according to a kind of a photolithography and etching conditions, which are used herein.

The phase change material layer 22, the most critical part of the phase change memory device, is generally formed of an alloy of chalcogenide metal elements. The phase change material layer 22 has various phase change characteristics according to elements of a metal alloy and a composition thereof. The phase change material layer 22 is formed to fill the active pore 20, and thus is in contact with the heat-generating electrode layer 16 exposed through the active pore 20. The phase change material layer 22 may be formed by sputtering or electron beam deposition.

The phase change material layer 22 may be patterned by an etching process, so as to form the phase change material layer 22 only at a specific position where the phase change memory device will be fabricated. Meanwhile, a chalcogenide phase change material has mainly been used as a material for an optical information recording medium such as an optical disk so far. However, little is known about characteristics associated with a semiconductor process such as etch characteristics, and thus effective conditions for etching must be deduced to apply the phase change memory device having a specific element composition to the phase change memory device. In the etching process, dry etching equipment using plasma may be mainly used, and a proper etch gas and proper etching conditions may be used. The phase change material layer may be etched in an etch chamber at a pressure of 3 to 5 mTorr. RF power for etching the phase change material layer may be 400 to 800 W. Further, a gas for etching the phase change material layer may be a mixed gas of argon (Ar) and chlorine ($Cl_2$), or a mixed gas of Ar and carbon tetrafluoride ($CF_4$) in some cases.

The second insulating layer 24 serves to electrically insulate the phase change material layer 22 from the upper electrode layer 28, and may be formed of at least one selected from a silicon oxide layer, a silicon nitride layer (SiN), a silicon-based insulating layer, and an organic insulating layer which may be formed at a low temperature, like the first insulating layer 18.

The second insulating layer 24 may be also formed at a low temperature to prevent oxidation of the phase change material layer 22 and change of the crystallized state of the phase change material layer 22. Further, a heat transfer characteristic of the first and second insulating layers 18 and 24 critically affects the operating characteristics of the phase change memory device, and thus care must be taken in selecting materials for the insulating layers.

The upper electrode layer 28 serves as an upper terminal of the phase change memory device, and is formed of a low-resistance metal electrode, for example, platinum (Pt), tungsten (W) or a titanium-tungsten (TiW) alloy, by sputtering or electron beam metal deposition, like the lower electrode layer 14.

Here, a separate diffusion barrier layer (not illustrated) may be interposed between the upper electrode layer 28 and the phase change material layer 22 to prevent unnecessary reaction or migration of elements, which may occur at an interface, and to enhance interface characteristics.

That is, most of all, the phase change memory device according to the present invention is characterized by using $Ge_2Sb_{2+x}Te_5$ ($0.12 \leq x \leq 0.32$) as a material for the phase change material layer 22, and thus will now be described in more detail.

In the present embodiment, the phase change material layer 22 was formed of $Ge_2Sb_{2+x}Te_5$ ($0.12 \leq x \leq 0.32$) by RF magnetron sputtering. Here, to change a composition (x) of antimony added to the $Ge_2Sb_{2+x}Te_5$ ($0.12 \leq x \leq 0.32$) forming the phase change material layer, a $Ge_2Sb_2Te_5$ target having a composition of 2:2:5 and an Sb target are used, and a sputtering power condition applied to the Sb target is adjusted to 10, 20, 30 or 40 W. Here, a sputtering power condition applied to the $Ge_2Sb_2Te_5$ target is 100 W.

As a result, in the formation of the phase change material layer 22 formed of $Ge_2Sb_{2+x}Te_5$ ($0.12 \leq x \leq 0.32$), when the sputtering power applied to the Sb target is changed to 10, 20, 30 or 40 W, an Sb percentage added to $Ge_2Sb_{2+x}Te_5$ is 12, 22, 27 or 32%, respectively. Chemical formulae of the elements of $Ge_2Sb_{2+x}Te_5$ corresponding to additional Sb percentages of 12, 22, 27 and 32% are expressed as $Ge_{21}Sb_{31}Te_{48}$, $Ge_{18}Sb_{39}Te_{43}$, $Ge_{17}Sb_{43}Te_{40}$ and $Ge_{16}Sb_{47}Te_{37}$, respectively, when the sum of all elements formed of Ge—Sb—Te is 100%.

In the present embodiment, to clearly define a relationship between the characteristics of the phase change memory device and the composition (x) of antimony added in the phase change material layer, as the additional Sb composition (x) is adjusted under several conditions in the $Ge_2Sb_{2+x}Te_5$ ($0.12 \leq x \leq 0.32$) forming the phase change material layer, a sputtering method using two sputtering targets is used in the formation of the phase change material layer. However, the phase change material layer formed of $Ge_2Sb_{2+x}Te_5$ ($0.12 \leq x \leq 0.32$) according to the present invention may also be formed by sputtering using a single target having a corresponding composition to form a phase change material layer with the specific composition.

Further, after forming the phase change material layer 22 formed of $Ge_2Sb_{2+x}Te_5$ ($0.12 \leq x \leq 0.32$) according to the present invention through the proper exemplary embodiment described above, the composition in the formed phase change material layer 22 may be analyzed by the following method. To this end, electron probe micro analysis (EPMA), energy dispersive X-ray (EDX) analysis, Auger electron spectroscopy (AES), inductively coupled plasma (ICP) spectroscopy, or Rutherford backscattering spectrometry (RBS) may be used, or a composition of an unknown thin film sample may be exactly estimated using a sample with an already known composition ratio or using at least two different measurement methods. In the present embodiment, the composition of the phase change material layer formed of $Ge_2Sb_{2+x}Te_5$ ($0.12 \leq x \leq 0.32$) according to the present invention is analyzed in combination with AES and EPMA.

Figure 2A:
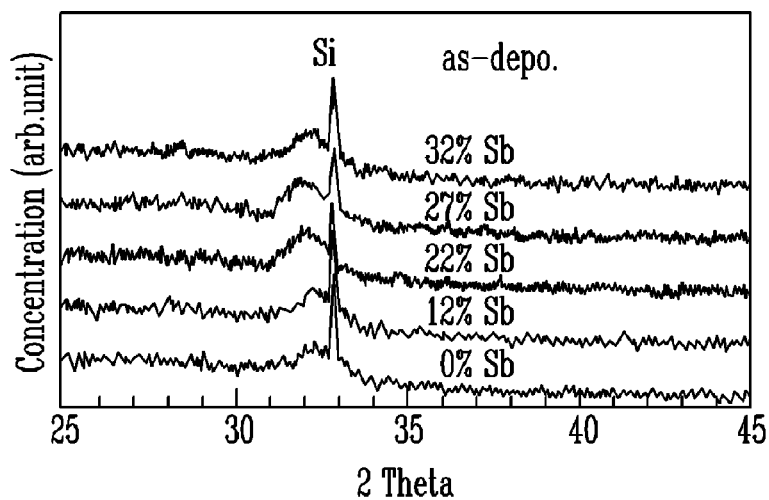
FIGS. 2A to 2C illustrate X-ray diffraction patterns representing a phase change characteristic of a chalcogenide phase change material layer formed of $Ge_2Sb_{2+x}Te_5$ ($0.12 \leq x \leq 0.32$) with different compositions according to the present invention, respectively.
Figure 2B:
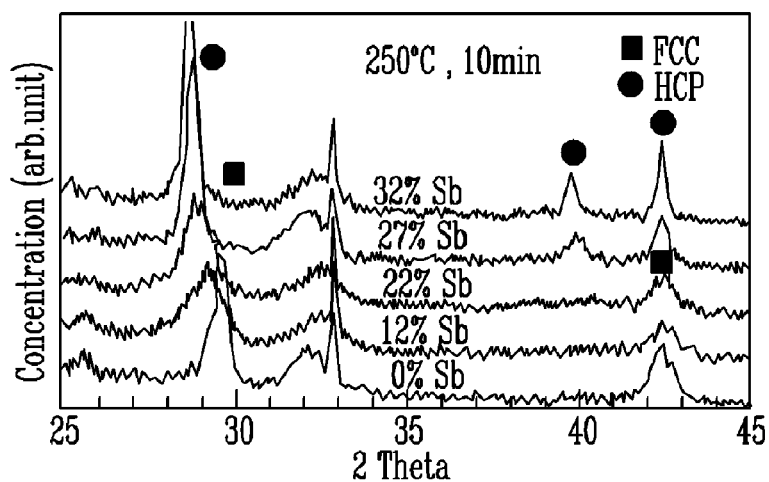
Figure 2C:
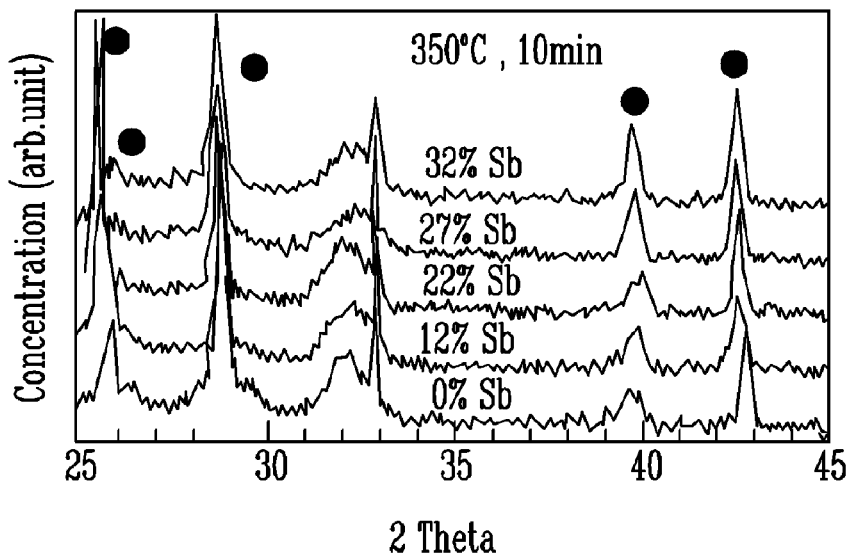

FIGS. 2A to 2C illustrate X-ray diffraction patterns representing a phase change characteristic of a chalcogenide phase change material layer formed of $Ge_2Sb_{2+x}Te_5$ ($0.12 \leq x \leq 0.32$) with different compositions according to the present invention, respectively.

Referring to FIG. 2A, it can be seen that all phase change material layers with different compositions have an amorphous structure when the phase change material layers are formed using $Ge_2Sb_{2+x}Te_5$ ($0.12 \leq x \leq 0.32$) with different compositions according to the present invention and not annealed.

Referring to FIG. 2C, it can be seen that all phase change material layers with different compositions have an hcp crystalline phase when the phase change material layers are formed using $Ge_2Sb_{2+x}Te_5$ ($0.12 \leq x \leq 0.32$) with different compositions according to the present invention and annealed for 10 min at 350° C. This is because the annealing temperature condition of 300° C. is high enough for the all phase change material layers with different compositions to transition to the stable hcp phase.

Referring to FIG. 2B, it can be seen that as the additional Sb composition increases, a diffraction pattern peak representing an fcc structure moves to a diffraction pattern peak representing an hcp structure, when the phase change material layers are formed using $Ge_2Sb_{2+x}Te_5$ ($0.12 \leq x \leq 0.32$) with different compositions according to the present invention and annealed for 10 min at 250° C. The additional Sb in the phase change material layer formed of $Ge_2Sb_{2+x}Te_5$ ($0.12 \leq x \leq 0.32$) according to the present invention becomes a cause of the direct transition from an amorphous state to the stable hcp crystalline phase. In other words, it shows that when the additional Sb composition is 22% or more in the phase change material layer formed of $Ge_2Sb_{2+x}Te_5$ ($0.12 \leq x \leq 0.32$), the phase change material layer formed of $Ge_2Sb_{2+x}Te_5$ ($0.12 \leq x \leq 0.32$) may directly transition from the amorphous state to the stable hcp crystalline phase, not via a metastable fcc crystalline phase.

Figure 3:
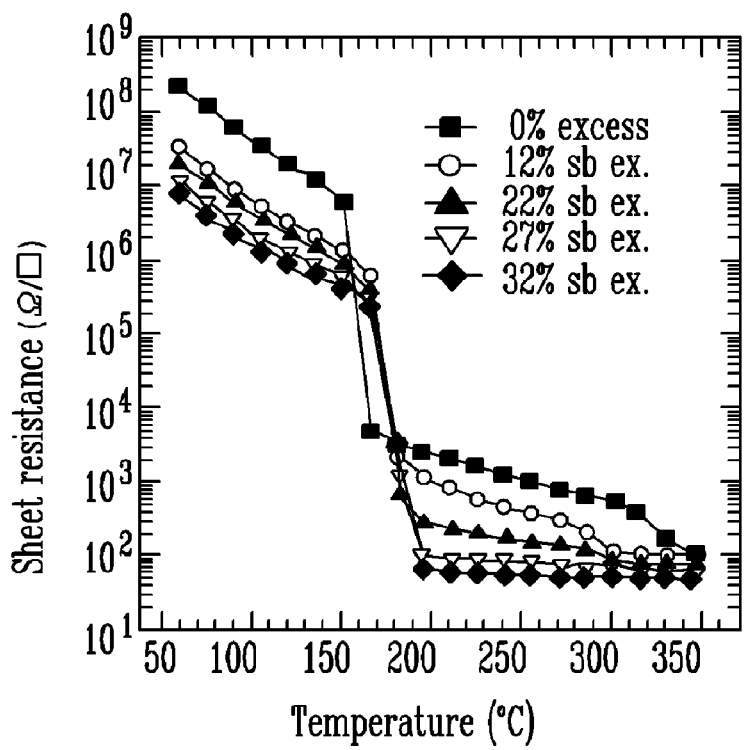
FIG. 3 illustrates sheet resistance-temperature curves of chalcogenide phase change material layers formed of $Ge_2Sb_{2+x}Te_5$ ($0.12 \leq x \leq 0.32$) with a different composition according to the present invention.

FIG. 3 illustrates sheet resistance-temperature curves of chalcogenide phase change material layers formed of $Ge_2Sb_{2+x}Te_5$ ($0.12 \leq x \leq 0.32$) with different compositions according to the present invention.

Referring to FIG. 3, it can be seen that the phase change material layer formed of $Ge_2Sb_2Te_5$ ($x=0$) has two inflection points at which the resistances are changed at about 160 and 320° C., when a sheet resistance of the phase change material layer formed using $Ge_2Sb_{2+x}Te_5$ ($0.12 \leq x \leq 0.32$) with a different composition according to the present is measured at temperatures increased by 5° C. per minute. It can be understood that these two inflection points indicate phase transition from the amorphous state to the metastable fcc crystalline phase in which a resistance is somewhat high, and phase transition from the fcc phase to a stable hcp crystalline phase in which a resistance is somewhat low, respectively. In contrast, it can be clearly seen as an increasing amount of Sb is added to the phase change material layer formed of $Ge_2Sb_{2+x}Te_5$ ($0.12 \leq x \leq 0.32$) according to the present invention, the transition from the amorphous state to the fcc crystalline phase disappears, and direct transition from the amorphous state to the hcp crystalline phase appears. It is expected that such a phenomenon occurring when the Sb is added 22% or more to form the phase change material layer of $Ge_2Sb_{2+x}Te_5$ reduces a distribution of a set resistance of the phase change memory device having the phase change material layer, provides a cause of implementation of a stable set operation during repetitive operations, and stably performs specific operation conditions thanks to a small distribution of the set resistance when a reset operation is performed in a set state.

Figure 4:
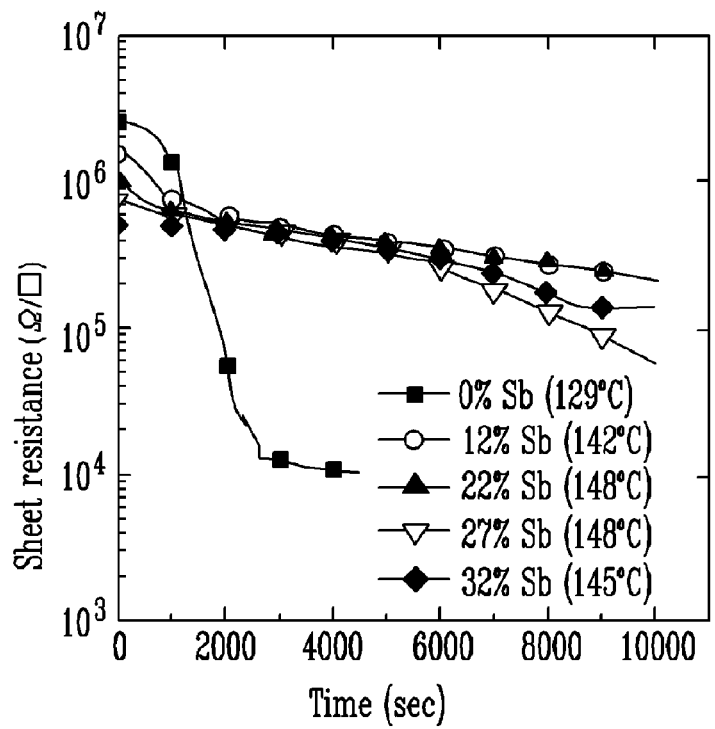
FIG. 4 illustrates a change of an amorphous resistance according to a change in time at a temperature lower than crystallization temperature of the chalcogenide phase change material layer by 30° C., in which the chalcogenide phase change material layer is formed of $Ge_2Sb_{2+x}Te_5$ ($0.12 \leq x \leq 0.32$) with a different composition according to the present invention.

FIG. 4 illustrates a change of an amorphous resistance according to a change in time at a temperature lower than crystallization temperature of the chalcogenide phase change material layer by 30° C., in which the chalcogenide phase change material layer is formed of $Ge_2Sb_{2+x}Te_5$ ($0.12 \leq x \leq 0.32$) with a different composition according to the present invention.

Referring to FIG. 4, in the phase change material layer formed of $Ge_2Sb_2Te_5$ ($x=0$), a retention time in which a reset resistance may be maintained at 99° C. lower than 129° C. by 30° C., i.e., the crystallization temperature of the phase change material with the above composition, is only 1000 seconds, and the reset resistance moves to a lower resistance close to the set resistance state 2500 seconds later. It can be understood that even if the phase change material layer is amorphous, the phase change material layer is recrystallized at a high temperature around the crystallization temperature, and the resistance change occurs due to the crystallization process after a specific time. In contrast, in the phase change material layer formed of $Ge_2Sb_{2+x}Te_5$ according to the present invention, the additional Sb may shorten the time when the amorphous resistance is changed to be close to the crystalline resistance due to the recrystallization process. These results show that when the phase change material layer formed of $Ge_2Sb_{2+x}Te_5$ according to the present invention is applied to the phase change memory device, data retention stability in a reset state at a high temperature may be improved, and a thermal interference phenomenon due to a write signal applied to an adjacent cell during the operation may be suppressed.

Figure 5:
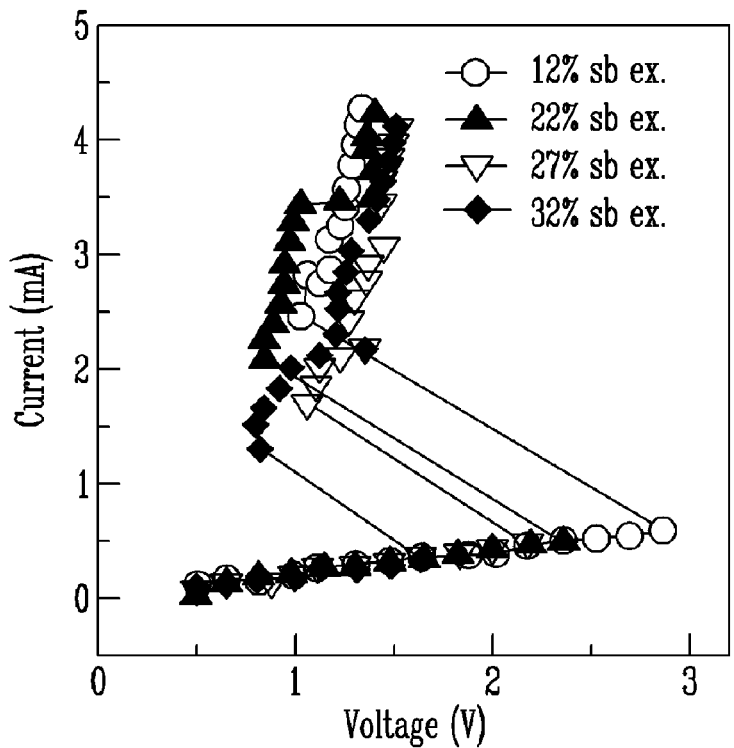
FIG. 5 illustrates a set operating characteristic of the phase change memory device including the chalcogenide phase change material layer formed of $Ge_2Sb_{2+x}Te_5$ ($0.12 \leq x \leq 0.32$) with a different composition according to the present invention.

FIG. 5 illustrates a set operating characteristic of the phase change memory device including the chalcogenide phase change material layer formed of $Ge_2Sb_{2+x}Te_5$ ($0.12 \leq x \leq 0.32$) with a different composition according to the present invention.

Referring to FIG. 5, the phase change memory device having the phase change material layer formed of $Ge_2Sb_{2+x}Te_5$ ($0.12 \leq x \leq 0.32$) with a different composition exhibits a negative resistance characteristic caused by an electrical switching phenomenon and a phase change phenomenon of the phase change material layer, and transitions from a state having a high resistance state to a low resistance state. In other words, when voltage applied to both terminals of the memory device reaches a specific threshold voltage due to increasing current applied, the electrical switching phenomenon takes place, the phase transition phenomenon from the amorphous state to the crystalline state occurs in the phase change material layer, and thereby a crystallization process is developed due to heat energy to be applied later.

Figure 6:
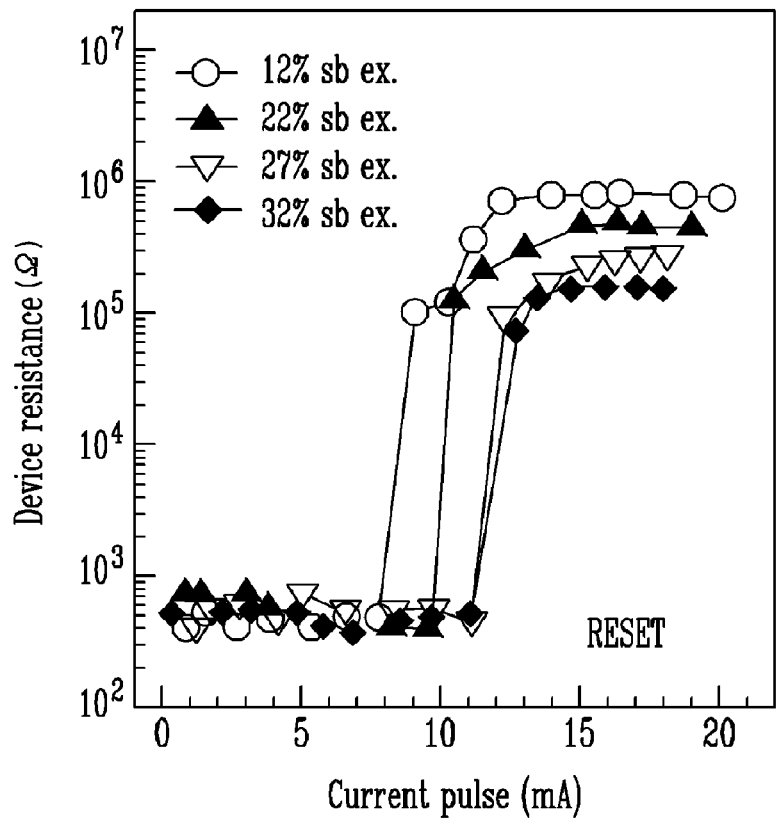
FIG. 6 illustrates a reset operating characteristic of the phase change memory device including the chalcogenide phase change material layer formed of $Ge_2Sb_{2+x}Te_5$ ($0.12 \leq x \leq 0.32$) with a different composition according to the present invention.

FIG. 6 illustrates a reset operating characteristic of the phase change memory device including the chalcogenide phase change material layer formed of $Ge_2Sb_{2+x}Te_5$ ($0.12 \leq x \leq 0.32$) with a different composition according to the present invention.

Referring to FIG. 6, the memory device having the phase change material layer formed of $Ge_2Sb_{2+x}Te_5$ ($0.12 \leq x \leq 0.32$) with a different composition according to the present invention performs a normal reset operation of transitioning from a low-resistance set state to a high-resistance reset state due to application of a specific current signal. Meanwhile, reduction in a reset resistance is proportional to the additional Sb, which corresponds to a material characteristic of the phase change material layer formed of $Ge_2Sb_{2+x}Te_5$ according to the present invention. It can be seen that a current required for the reset operation is in a range from 10 to 14 mA, and from the measurement results for several devices, a reset current is not directly related to the additional Sb.

That is, as illustrated in FIGS. 5 and 6, it can be seen that the phase change material layer formed of $Ge_2Sb_{2+x}Te_5$ ($0.12 \leq x \leq 0.32$) according to the present invention does not have a stoichiometric composition, but has no problem with a memory operation as a phase change memory device.

Figure 7:
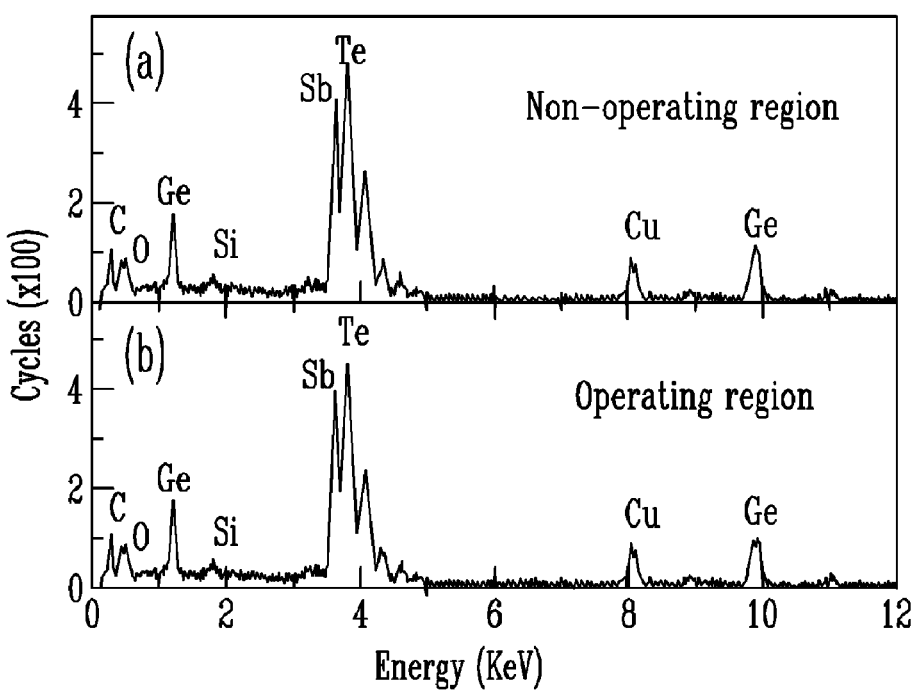
FIG. 7 illustrates a result of analyzing material compositions in a device operation region and a peripheral region thereof after rewrite operations of more than $1 \times 10^6$ cycles are repeatedly performed by a phase change memory device including a chalcogenide phase change material layer formed of $Ge_2Sb_{2+x}Te_5$ (x=0.22) according to the present invention.

FIG. 7 illustrates a result of analyzing material compositions in a device operation region and a peripheral region thereof after rewrite operations of more than $1 \times 10^6$ cycles are repeatedly performed by a phase change memory device including a chalcogenide phase change material layer formed of $Ge_2Sb_{2+x}Te_5$ (x=0.22) according to the present invention.

Referring to FIG. 7, it can be seen that a material composition in a device operating region is not greatly changed from that in the peripheral region thereof which is not participant to the device operation when the phase change memory device having the phase change material layer formed of $Ge_2Sb_{2+x}Te_5$ (x=0.22) according to the present invention repeatedly performs a write operation at least $1 \times 10^6$ cycles. Specifically, it has been explained that the device operating region is accompanied with heat during the operation of the phase change memory device, and in the phase change memory device fabricated using a $Ge_2Sb_2Te_5$ (x=0) phase change material layer, the material composition in the device operating region is likely to be greatly changed after the write operation has been repeated for a predetermined number of cycles. The composition analysis result of FIG. 7 is very different from that in the phase change memory device including the phase change material layer formed of $Ge_2Sb_2Te_5$ (x=0), and shows that the phase change material layer formed of Sb-rich $Ge_2Sb_{2+x}Te_5$ according to the present invention is superior to the conventional phase change material layer formed of $Ge_2Sb_2Te_5$ (x=0) in tolerance to a phase separation phenomenon or a compositional change during the rewrite operation accompanying heat generation.

As a result, when the phase change memory device is fabricated by forming the phase change material layer using $Ge_2Sb_{2+x}Te_5$ ($0.12 \leq x \leq 0.32$) according to the present invention, it is very important to optimize an additional Sb composition (x), and considerations for determining a composition of the phase change material layer are as follows.

First, the additional Sb composition (x) in the phase change material layer formed of $Ge_2Sb_{2+x}Te_5$ according to the present invention must be determined within a range in which the phase change material layer has a single crystalline phase structure, and amorphous resistance must be constantly maintained for a predetermined time (e.g., 3 hrs) at a high temperature around crystallization temperature, i.e., a temperature less than the crystallization temperature by 30° C. According to the results shown in FIGS. 2 to 4, for the direct phase transition of the phase change material layer formed of $Ge_2Sb_{2+x}Te_5$ according to the present invention from an amorphous state to a single hcp crystalline phase structure at a predetermined temperature, the additional Sb composition must be at least 0.22. Even when the additional Sb composition is less than 0.22, phase transition from the amorphous state to the fcc crystalline phase occurs less, and thus the chances are that the phase change material layer will have a single crystalline phase structure. Further, the amorphous resistance of the phase change material layer formed of $Ge_2Sb_{2+x}Te_5$ ($0.12 \leq x \leq 0.32$) according to the present invention may highly increase amorphous state stability at a high temperature around the crystallization temperature for the phase change material layer when 12% or more amount of Sb is added. Thus, the additional Sb composition (x) selected within the range of $0.12 \leq x \leq 0.32$ suggested in the present embodiment may be significant. Consequently, the additional Sb composition (x) in the phase change material layer formed of $Ge_2Sb_{2+x}Te_5$ ($0.12 \leq x \leq 0.32$) according to the present invention may be adjusted in the range of $0.12 \leq x \leq 0.32$, and preferably, $0.22 \leq x \leq 0.32$.

Second, the additional Sb composition (x) in the phase change material layer formed of $Ge_2Sb_{2+x}Te_5$ according to the present invention must be determined in a range in which other characteristics required for the phase change memory device, for example, operating current and speed, and a rewrite operating characteristic are not seriously damaged. According to the results shown in FIGS. 5 to 7, the phase change memory device including the phase change material layer formed of $Ge_2Sb_{2+x}Te_5$ ($0.12 \leq x \leq 0.32$) in the present embodiment performs normal set and reset operations. As the additional Sb composition (x) increases in the phase change material layer formed of $Ge_2Sb_{2+x}Te_5$ ($0.12 \leq x \leq 0.32$) according to the present invention, the operating speed required for the set operation decreases slightly. This phenomenon has a trade-off relationship with an increase in stability of the reset operation, and thus the additional Sb composition (x) in the phase change material layer formed of $Ge_2Sb_{2+x}Te_5$ ($0.12 \leq x \leq 0.32$) according to the present invention may not be set to 0.27 or more. According to evaluation of the rewrite operating characteristic of the phase change memory device including the phase change material layer formed of $Ge_2Sb_{2+x}Te_5$ ($0.12 \leq x \leq 0.32$) according to the present invention, 32% or more of the additional Sb (x=32) induces degradation of the rewrite operating characteristic. This phenomenon is contrary to the increase in tolerance to the phase stability and compositional segregation phenomenon of the phase change material layer formed of $Ge_2Sb_{2+x}Te_5$ ($0.12 \leq x \leq 0.32$) according to the present invention, as described with reference to FIG. 7. To be specific, the degradation of the rewrite operating characteristic may be caused by diffusion of excessively added Sb from the surface of the phase change material layer into an upper electrode layer and a heat-generating electrode layer forming the phase change memory device. Thus, the additional Sb composition (x) in the phase change material layer formed of $Ge_2Sb_{2+x}Te_5$ according to the present invention must be determined within a range in which other characteristics required for the phase change memory device, for example, the operating current and speed, and the rewrite operating characteristic are not seriously damaged. Thus the more preferable range is $0.12 \leq x \leq 0.27$ of the $0.12 \leq x \leq 0.32$ suggested in the present embodiment.

Consequently, considering the first and second considerations at the same time, it is more preferable that the additional Sb composition (x) in the phase change material layer formed of $Ge_2Sb_{2+x}Te_5$ ($0.12 \leq x \leq 0.32$) according to the present invention be adjusted within a range from $0.22 \leq x \leq 0.27$, in order to increase operation stability and operation reliability of the phase change memory device including the phase change material layer formed of $Ge_2Sb_{2+x}Te_5$ ($0.12 \leq x \leq 0.32$) according to the present invention and to ensure other memory operating characteristics required for the phase change memory device.

Figure 8A:
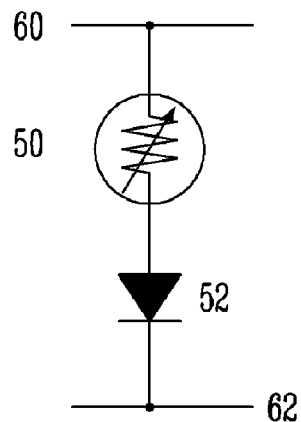
FIGS. 8A to 8C are schematic circuit diagrams of phase change memory unit cells constituted by one phase change memory device including a chalcogenide phase change material layer formed of $Ge_2Sb_{2+x}Te_5$ ($0.12 \leq x \leq 0.32$) and one driving device according to the present invention, respectively.
Figure 8B:
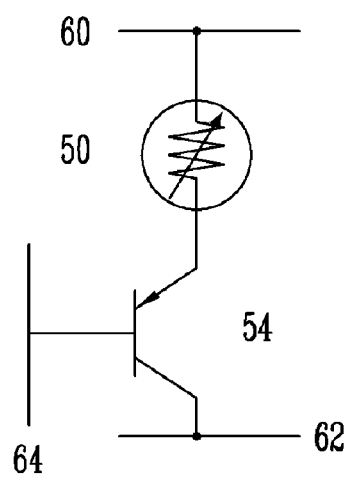
Figure 8C:
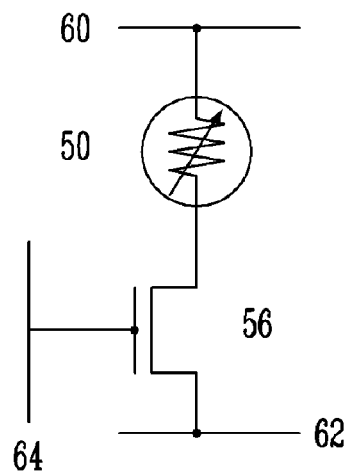

FIGS. 8A to 8C are schematic circuit diagrams of phase change memory unit cells constituted by one phase change memory device including a chalcogenide phase change material layer formed of $Ge_2Sb_{2+x}Te_5$ ($0.12 \leq x \leq 0.32$) and one driving device according to the present invention, respectively.

Referring to FIGS. 8A to 8C, when the phase change memory device according to the present invention is formed in an array, so that a memory array having a predetermined degree of integration is formed, the phase change memory unit cell generally includes one phase change memory device 50 serving to store data, and one driving device 52, 54 or 56 for selecting phase change memory to store data or read the stored data.

First of all, referring to FIG. 8A, the driving device 52 for selecting a memory device may use a two-terminal diode. Here, one of the terminals of the phase change memory device 50 is connected with a bit line 60, and the other is connected with a terminal of the diode 52. The other terminal of the diode is also connected with a plate line 62. Among operations of the phase change memory cell, an operation of writing data to the phase change memory device or changing the stored data may be performed using a difference between voltages applied to the bit line 60 and the plate line 62. In a phase change memory array formed of a plurality of phase change memory cells, data may be written to or read from a selected phase change memory device by changing a voltage signal applied to pluralities of the bit lines and plate lines. However, in this case, the driving device for selecting a memory device uses a 2-terminal diode, so that a degree of freedom in the voltage application may be lowered and thus there may be a limitation to a driving method for selecting a desired memory device. For these reasons, in actual process of fabricating a phase change memory array using the phase change memory device, a bipolar transistor or a MOS transistor is preferably selected as the driving device for selecting a memory device instead of a diode.

Next, referring to FIG. 8B, the driving device 54 for selecting a memory device may use a three-terminal bipolar transistor. Here, one of two terminals of a phase change memory device 50 is connected with one terminal of a bit line 60, and the other is connected with an emitter terminal of the bipolar transistor 54. A collector terminal of the bipolar transistor 54 is also connected with a plate line 62, and a base terminal of the bipolar transistor 54 is connected with a word line 64. Among the operations of the phase change memory cell, an operation of writing data to the phase change memory device, or changing the stored data may be performed using a difference between voltages applied to the bit line 60 and the plate line 62. Here, phase change memory to perform the data write operation may be selected by applying predetermined voltage to the word line 64 connected with the base terminal of the bipolar transistor 54. That is, in a phase change memory array formed of a plurality of phase change memory cells, data may be stored to or read from a selected phase change memory device by changing a voltage signal applied to pluralities of the bit lines, plate lines and word lines. As illustrated in FIG. 8B, when the drive device for selecting a memory device uses the bipolar transistor, a CMOS compatible process cannot be used so that the process complexity increases, but relatively high current may be obtained using a small-scale device. Thus, the bipolar transistor may be selected as a driving device when a high degree of integration is demanded.

Finally, referring to FIG. 8C, the driving device 56 for selecting a memory device may use a three-terminal MOS transistor. Here, one of two terminals of a phase change memory device 50 is connected with a bit line 60, and the other is connected with a drain terminal of the MOS transistor 56. Further, a source terminal of the MOS transistor 56 is connected with a plate line 62, and a gate terminal is connected with a word line 64. Among the operations of the phase change memory cell, an operation of writing data to the phase change memory device or changing the stored data may be performed using a difference between voltages applied to the bit line 60 and the plate line 62. Here, a phase change memory to write data may be selected by applying predetermined voltage to the word line 64 connected with the gate terminal of the MOS transistor 56. That is, in a phase change memory array formed of a plurality of phase change memory cells, data may be written to or read from a selected phase change memory device by changing a voltage signal applied to pluralities of the bit lines, plate lines and word lines. As illustrated in FIG. 8C, when the driving device for selecting a memory device uses a MOS transistor, to obtain current sufficient to operate the phase change memory device, a relatively large-scaled MOS transistor is needed, so that a degree of integration cannot be raised to a maximum level. However, the MOS transistor can be fabricated in a CMOS compatible process, so that the process complexity decreases, and other LSI devices can be integrated with the memory device. Thus, the MOS transistor 56 may be selected as a driving device when a decrease in steps of the process is needed or an embedded memory array is fabricated.

Meanwhile, when the MOS transistor 56 is used as the driving device of the phase change memory device constituting the phase change memory unit cell, the MOS transistor may have a three-dimensional channel to scale down the cell, and obtain sufficient driving current. In the phase change memory unit cell, the three-dimensional structure of the MOS transistor has an advantage of large scale-down in the phase change memory unit cell by structure change of the driving device. When the driving device is scaled down by a common design rule, an amount of driving current obtained from the driving device may be lower than that of operating current required for a normal memory operation of the phase change memory device. To solve this problem, when the phase change memory unit cell is formed by the same design rule as the driving device, operating current of the phase change memory device itself must decrease, otherwise the amount of the driving current must be increased by enlarging the driving device. However, enlarging the driving device greatly reduces a degree of integration capacity of the phase change memory array, which is not preferable in general. Therefore, the phase change memory array may be formed without the enlargement of the driving device, when the operating current required for driving the phase change memory device is sufficiently supplied by changing the structure of the driving device.

When the MOS transistor 56 is used as the driving device of the phase change memory device constituting the phase change memory unit cell, methods for maintaining the small size of the device and ensuring sufficient current drivability by introducing the three-dimensional structure are as follows. First, a FINFET structure is employed. In the FINFET structure, sidewalls and an upper surface of a semiconductor active layer constituting the MOS transistor are surrounded by a gate electrode to serve as channels, and thus the drivability of the device may be improved. Second, an OMEGA-Gate structure is employed. In the OMEGA-Gate structure, a part of a lower surface as well as the sidewalls and the upper surface of the semiconductor active layer constituting the MOS transistor are surrounded by the gate electrode to serve as channels, and thus the drivability of the device may be improved. Third, a Gate-All-Around (GAA) structure is employed. In the GAA structure, the entire lower surface as well as the sidewalls and the upper surface of the semiconductor active layer constituting the MOS transistor are surrounded by the gate electrode to serve as channels, and thus the drivability of the device may be improved. Fourth, a Multi-Bridge-Channel (MBC) structure is employed. In the MBC structure, the semiconductor active layer and the gate electrode layer are stacked perpendicular to each other several times to form a plurality of channels, and thus the drivability of the device may be improved.

A method of fabricating a phase change memory device according to the present invention will now be described in detail with reference to the accompanying drawings.

Figure 9:
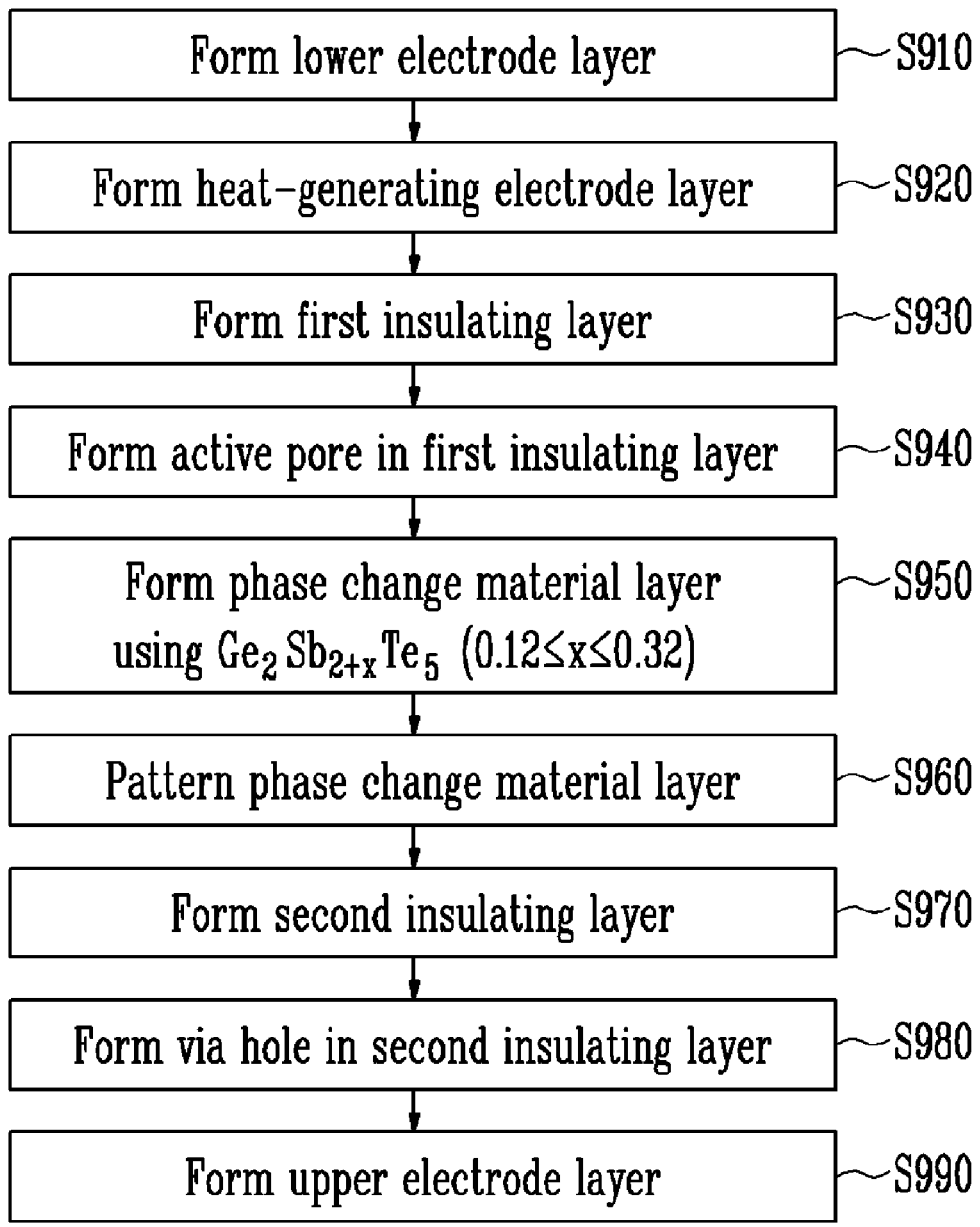
FIG. 9 is a flowchart illustrating a method of fabricating a phase change memory device according to the present invention.

FIG. 9 is a flowchart illustrating a method of fabricating a phase change memory device according to an exemplary embodiment of the present invention, which may be changed in various ways within the scope of the present invention. A phase change memory device below will be explained with reference to FIG. 1.

Referring to FIG. 9, a lower electrode layer 14 is formed on a substrate 10 (S910).

The substrate 10 may be formed of silicon oxide on silicon to have a thickness of about 6000 Å. In addition, the lower electrode layer 14 may be formed of a low-resistive metal, e.g., platinum (Pt), tungsten (W) or a titanium-tungsten alloy (TiW), by sputtering or electron beam metal deposition.

In the present embodiment, the lower electrode layer 14 is formed of a titanium-tungsten (TiW) alloy to have a thickness of about 2000 Å by sputtering.

Subsequently, a heat-generating electrode layer 16 is formed on the lower electrode layer 14 (S920).

Here, the heat-generating electrode layer 16 may be formed of a higher resistive material than the lower electrode layer 14, e.g., titanium nitride (TiN), titanium oxynitride (TiON), titanium aluminum nitride (TiAlN), titanium silicon nitride (TiSiN), tantalum aluminum nitride (TaAlN) or tantalum silicon nitride (TaSiN), to generate heat sufficient to change a crystalline state of a phase change material at a contact portion with a phase change material layer 22.

In the present embodiment, the heat-generating electrode layer 16 is formed of titanium nitride (TiN) to have a thickness of about 500 Å by sputtering.

Subsequently, a first insulating layer 18 is formed by a common method such as sputtering or electron beam metal deposition (S930).

Here, the first insulating layer 18 may be formed of at least one selected from a silicon oxide layer, a silicon nitride layer (SiN), a silicon-based insulating layer, and an organic insulating layer which can be formed at a low temperature to electrically or thermally insulate memory devices from each other in an array structure of the phase change memory device.

For example, when the first insulating layer 18 uses a silicon oxide layer, the silicon oxide layer may be formed by chemical vapor deposition at a low temperature. This is to prevent oxidation of the heat-generating electrode layer 16 during the formation of the first insulating layer 18. Further, a proper isolation process may be performed by the formation of the first insulating layer 18. That is, when the first insulating layer 18 uses the silicon oxide layer, a memory device portion may be isolated therefrom by ensuring a portion to be defined as a phase change memory device region by dry or wet etching.

In the present embodiment, the first insulating layer 18 is formed of silicon oxide ($SiO_2$) to have a thickness of about 2000 Å by plasma enhanced chemical vapor deposition (PECVD) at about 400° C.

Subsequently, the first insulating layer 18 is etched to form an active pore 20 (S940).

Here, the active pore 20 region is a region where the phase change memory device is actually operated. A size of the active pore 20 directly affects operating characteristics of the phase change memory device, and a decrease of the active pore 20 in size may lower current required for the operation. Meanwhile, the size of the active pore 20 is dependant on a kind of the lithography process and conditions of the etching process used.

In the present embodiment, the active pore 20 is formed using photolithography equipment employing an i-line, and formed to a size of about 500 nm. The active pore 20 is formed of a silicon oxide layer by dry etching.

Meanwhile, the active pore 20 having a size of about 500 nm is large enough to satisfy conditions required for the operation of the phase change memory device to be actually commercialized. Thus, in the fabrication of the phase change memory device including a phase change material layer formed of $Ge_2Sb_{2+x}Te_5$ according to the present invention, the active pore 20 may be formed smaller than the 500 nm used herein. Here, patterning equipment, e.g., KrF, ArF or electron beam lithography equipment may be used, which has a higher patterning resolution than that of the i-line lithography equipment used herein.

Then, a phase change material layer 22 is formed of $Ge_2Sb_{2+x}Te_5$ ($0.12 \leq x \leq 0.32$) to fill the active pore 20 (S950), and thus the phase change material layer 22 is in contact with the heat-generating electrode layer 16 only in the active pore 20 region.

Here, the phase change material layer 22 may have a single crystalline phase state, and an amorphous resistance characteristic constantly maintained for a predetermined time (e.g., 3 hrs) at a high temperature, which is lower than the crystallization temperature by 30° C. To this end, the composition (x) of antimony added to the $Ge_2Sb_{2+x}Te_5$ as an excess may range from 0.22 to 0.27.

In the present embodiment, the phase change material layer 22 is formed of $Ge_2Sb_{2+x}Te_5$ ($0.12 \leq x \leq 0.32$) to have a thickness of 3000 Å by RF magnetron sputtering. Here, targets for changing an Sb composition include a $Ge_2Sb_2Te_5$ target having a composition of 2:2:5 and an Sb target, and a condition of sputtering power applied to the Sb target may be changed to 10, 20, 30 and 40 W, so that the Sb composition in the phase change material layer formed of $Ge_2Sb_{2+x}Te_5$ ($0.12 \leq x \leq 0.32$) according to the present invention may be changed. Here, the sputtering power condition applied to the $Ge_2Sb_2Te_5$ target is 100 W.

Subsequently, the phase change material layer 22 is patterned by etching, so as to form the phase change material layer 22 only in a predetermined location where a phase change memory device will be fabricated (S960).

Here, to pattern the phase change material layer 22, dry etching using plasma may be used. In the present embodiment, high-density helicon plasma equipment using helicon plasma is used as dry etching equipment and a mixed gas of argon (Ar) and chlorine ($Cl_2$) is used as an etch gas. Further, an RF source power used in etching is about 600 W, and an RF bias power applied to improve anisotropy of the plasma is about 150 W. Meanwhile, a chamber pressure is maintained at about 3 to 5 mTorr during the etching process. A composition of the Ar/$Cl_2$ mixed gas used in etching is 90/10.

In the meantime, since the first insulating layer 18 must not be over-etched during the process, the first insulting layer 18 must have a sufficient etch selectivity to the phase change material layer 22. Regarding the etch conditions, the first insulating layer 18, which is formed of a silicon oxide layer, has an etch rate of about 40 nm/min, and an etch selectivity of about 5. The etch selectivity is high enough to fabricate the phase change memory device according to the present invention, and in the present embodiment, the phase change material layer 22 is patterned using the above-mentioned etching equipment and conditions.

Subsequently, a second insulating layer 24 is formed on the phase change material layer 22 (S970).

Here, the second insulating layer 24 serves to electrically insulate the phase change material layer 22 from an upper electrode layer 28 to be formed thereon, and may be formed at a low temperature to prevent oxidation of the phase change material layer 22 and diffusion of elements. Further, during the formation of the second insulating layer 24, the crystalline state of the phase change material layer 22 must not be changed.

In the present embodiment, the second insulating layer 24 is formed of silicon oxide to have a thickness of about 2000 Å by ECR plasma chemical vapor deposition (ECRCVD). Here, the oxide layer is formed at room temperature. That is, the process of forming a silicon oxide layer by ECRCVD may be performed at room temperature, which is characteristic in the fabrication of the phase change memory device according to the present invention.

Subsequently, a via hole 26 is formed to form an upper electrode layer 28 on the second insulating layer 24 by partially removing the second insulating layer 24 by wet or dry etching (S980).

Then, an upper electrode layer 28 is formed on the second insulating layer 24 having the via hole 26 (S990).

Here, the upper electrode layer 28 serves as an upper terminal of the phase change memory device, and is formed of a low-resistance metal electrode, like the lower electrode layer 14. In some cases, between the upper electrode layer 28 and the phase change material layer 22, a separate diffusion barrier layer (not illustrated) may be formed to have good interface characteristics and prevent unnecessary reaction or migration of the elements which may occur at the interface.

In the present embodiment, the upper electrode layer 28 is formed of tungsten (W) to have a thickness of about 1000 Å by sputtering.

Meanwhile, although the structure of the phase change memory device, the composition of the elements and the method of fabricating the device described above are provided to easily explain the present invention, the present invention is not limited to the device's structure illustrated in FIG. 1. Thus, the structure may be changed or modified in various ways.

According to the present invention, as a phase change material layer of a phase change memory device is formed of $Ge_2Sb_{2+x}Te_5$ ($0.12 \leq x \leq 0.32$), during phase transition between crystalline and amorphous states of a phase change material, the crystalline state is determined as a single stable phase, not a mixed phase of a metastable phase and a stable phase, and the phase transition according to increasing temperature directly moves to the crystalline state having the single stable phase from the amorphous state. Thus, set operation stability and a distribution characteristic of a resistance in a set state of the phase change memory device may be drastically enhanced.

Further, according to the present invention, when the phase change material layer of the phase change memory device is formed of $Ge_2Sb_{2+x}Te_5$ ($0.12 \leq x \leq 0.32$), an amorphous resistance may be maintained for a predetermined time at a high temperature, e.g., around crystallization temperature, so that reset operation stability of the phase change memory device can be drastically enhanced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A phase change memory device, comprising:
   a phase change material layer formed of $Ge_2Sb_{2+x}Te_5$ ($x>0$) which is a germanium (Ge)-antimony (Sb)-tellurium (Te)-based material, wherein
   an excess (x) of antimony is added to $Ge_2Sb_2Te_5$ to compose the $Ge_2Sb_{2+x}Te_5$,
   the excess ranges from 0.22 to 0.32, and
   the phase change material layer directly transitions from an amorphous phase to a stable hcp crystalline phase without transitioning through a metastable fcc crystalline phase.

2. The phase change memory device according to claim 1, wherein the excess (x) of antimony ranges from 0.22 to 0.27 to maintain an amorphous resistance of the $Ge_2Sb_{2+x}Te_5$ at a constant level for a predetermined time under a temperature condition lower than the crystallization temperature of the $Ge_2Sb_{2+x}Te_5$ by 30° C. and to prevent diffusion of the $Ge_2Sb_{2+x}Te_5$ into another layer.

3. The phase change memory device according to claim 1, wherein the excess (x) of antimony ranges from 0.22 to 0.27.

4. The phase change memory device according to claim 1, further comprising:
   a lower electrode layer formed on a substrate to supply current;
   a heat-generating electrode layer formed entirely or partially on a surface of the lower electrode layer to generate heat by the current supplied from the lower electrode layer;
   a first insulating layer partially covering the heat-generating electrode layer, having a pore, and partially exposing a surface of the heat-generating electrode layer;
   a second insulating layer partially covering the phase change material layer, having a via hole, and partially exposing a surface of the phase change material layer; and
   an upper electrode layer formed to fill the via hole.

5. The phase change memory device according to claim 4, wherein the phase change material layer is formed to be in contact with the heat-generating electrode layer exposed through the pore, and fill the pore.

6. The phase change memory device according to claim 4, further comprising:
   a diffusion barrier layer interposed between the upper electrode layer and the phase change material layer.

7. The phase change memory device according to claim 1, wherein the phase change memory device is driven by one of a diode, a bipolar transistor and a MOS transistor.

8. The phase change memory device according to claim 7, wherein the MOS transistor has one of a FINFET structure, a structure having a three-dimensional gate electrode, which covers at least sidewalls of a semiconductor active layer to form a channel, and a structure having a plurality of gate electrodes.

9. A method of fabricating a phase change memory device, comprising:
   forming a phase change material layer using $Ge_2Sb_{2+x}Te_5$ ($x>0$) which is a germanium (Ge)-antimony (Sb)-tellurium (Te)-based material, wherein
   an excess (x) of antimony is added to $Ge_2Sb_2Te_5$ to compose the $Ge_2Sb_{2+x}Te_5$,
   the excess ranges from 0.22 to 0.32 and the phase change material layer directly transitions from an amorphous phase to a stable hcp crystalline phase without transitioning through a metastable fcc crystalline phase.

10. The method according to claim 9, wherein the composition (x) of antimony added to the $Ge_2Sb_{2+x}Te_5$ as an excess ranges from 0.22 to 0.27 to maintain an amorphous resistance of the $Ge_2Sb_{2+x}Te_5$ at a constant level for a predetermined time at a temperature lower than the crystallization temperature of the $Ge_2Sb_{2+x}Te_5$ by 30° C. and to prevent diffusion of the $Ge_2Sb_{2+x}Te_5$ into another layer.

11. The method according to claim 9, wherein the excess (x) ranges from 0.22 to 0.27.

12. The method according to claim 9, wherein the forming of the phase change material layer comprises respectively adjusting sputtering power applied to a $Ge_2Sb_2Te_5$ target and an Sb target to control the composition of the $Ge_2Sb_{2+x}Te_5$.

13. The method according to claim 9, wherein the forming of the phase change material layer comprises adjusting sputtering power applied to a single target of $Ge_2Sb_{2+x}Te_5$ to control the composition of the $Ge_2Sb_{2+x}Te_5$.

14. The method according to claim 9, further comprising:
before forming the phase change material layer,
forming a lower electrode layer on a substrate;
entirely or partially forming a heat-generating electrode layer on a surface of the lower electrode layer;
forming a first insulating layer to partially cover the heat-generating electrode layer; and
partially etching the first insulating layer and forming a pore in the first insulating layer to partially expose a surface of the heat-generating electrode layer.

15. The method according to claim 14, wherein after the pore is formed in the first insulating layer, the phase change material layer is formed to be in contact with the heat-generating electrode layer exposed through the pore and fill the pore.

16. The method according to claim 9, further comprising:
after forming the phase change material layer,
forming a second insulating layer on the phase change material layer;
partially etching the second insulating layer and forming a via hole in the second insulating layer to partially expose a surface of the phase change material layer; and
forming an upper electrode layer to be in contact with the phase change material layer exposed through the via hole, and fill the via hole.

17. The method according to claim 16, wherein the second insulating layer is formed by chemical vapor deposition using ECR plasma at room temperature.

18. The method according to claim 16, further comprising:
forming a diffusion barrier layer between the upper electrode layer and the phase change material layer.

19. A phase change memory device, comprising:
a phase change material layer formed of $Ge_2Sb_{2+x}Te_5$ ($0.27 \leq x \leq 0.32$) which is a germanium (Ge)-antimony (Sb)-tellurium (Te)-based material, wherein
the phase change material layer directly transitions from an amorphous phase to a stable hcp crystalline phase without transitioning through a metastable fcc crystalline phase.

* * * * *